United States Patent
Zhou

(10) Patent No.: US 10,121,860 B2
(45) Date of Patent: Nov. 6, 2018

(54) BJT STRUCTURE DESIGN FOR 14NM FINFET DEVICE

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/236,329

(22) Filed: Aug. 12, 2016

(65) Prior Publication Data
US 2017/0062564 A1    Mar. 2, 2017

(30) Foreign Application Priority Data

Sep. 1, 2015  (CN) .......................... 2015 1 0551705

(51) Int. Cl.
*H01L 29/08*  (2006.01)
*H01L 29/10*  (2006.01)
(Continued)

(52) U.S. Cl.
CPC .... *H01L 29/0808* (2013.01); *H01L 21/26586* (2013.01); *H01L 21/308* (2013.01);
(Continued)

(58) Field of Classification Search
CPC ............. H01L 29/0808; H01L 29/0804; H01L 29/0821; H01L 29/0684
See application file for complete search history.

(56) References Cited

U.S. PATENT DOCUMENTS

| | | | |
|---|---|---|---|
| 9,882,027 B2* | 1/2018 | Liao | H01L 29/66795 |
| 2010/0187656 A1* | 7/2010 | Ke | H01L 29/73 257/586 |

(Continued)

*Primary Examiner* — Christine Enad
(74) *Attorney, Agent, or Firm* — Kilpatrick Townsend & Stockton LLP

(57) ABSTRACT

A fin-type bipolar semiconductor device includes a base region having a first portion in a semiconductor substrate and a first semiconductor fin on the adjacent first portion, a collector region having a second portion in the semiconductor substrate and a second semiconductor fin on the adjacent second portion, and an emitter region having a third region in the semiconductor substrate and a third semiconductor fin on the adjacent third portion. The second portion is adjacent the first portion, and the third portion is adjacent the first portion and forms an emitter junction in the semiconductor substrate. The second portion is not adjacent to the third portion. The first, second, and third semiconductor fins are physically separated from each other. The fin-type bipolar device exhibits low leakage current, good linearity and uniformity of electrical characteristics to facilitate device matching.

17 Claims, 13 Drawing Sheets

(51) Int. Cl.
  *H01L 21/768* (2006.01)
  *H01L 29/735* (2006.01)
  *H01L 29/66* (2006.01)
  *H01L 21/306* (2006.01)
  *H01L 21/265* (2006.01)
  *H01L 21/308* (2006.01)
  *H01L 21/324* (2006.01)
  *H01L 23/535* (2006.01)
  *H01L 29/06* (2006.01)

(52) U.S. Cl.
  CPC ...... *H01L 21/30604* (2013.01); *H01L 21/324* (2013.01); *H01L 21/76895* (2013.01); *H01L 23/535* (2013.01); *H01L 29/0684* (2013.01); *H01L 29/0821* (2013.01); *H01L 29/1008* (2013.01); *H01L 29/6625* (2013.01); *H01L 29/735* (2013.01)

(56) References Cited

U.S. PATENT DOCUMENTS

| | | | |
|---|---|---|---|
| 2012/0032303 A1* | 2/2012 | Elkareh | H01L 29/7322 257/587 |
| 2013/0168819 A1* | 7/2013 | Chang | H01L 29/735 257/565 |
| 2013/0328162 A1* | 12/2013 | Hu | H01L 27/0629 257/526 |
| 2015/0102348 A1* | 4/2015 | Cai | H01L 29/785 257/69 |
| 2015/0236116 A1* | 8/2015 | Chang | H01L 29/6625 438/338 |
| 2015/0311342 A1* | 10/2015 | Lin | H01L 29/7848 257/190 |
| 2016/0064372 A1* | 3/2016 | Singh | H01L 27/088 257/355 |
| 2017/0054003 A1* | 2/2017 | Liao | H01L 29/66795 |
| 2017/0062564 A1* | 3/2017 | Zhou | H01L 29/0684 |

* cited by examiner

BJT STRUCTURE DESIGN FOR 14NM FINFET DEVICE

CROSS-REFERENCES TO RELATED APPLICATIONS

This application claims priority to Chinese patent application No. 201510551705.7, filed on Sep. 1, 2015, the content of which is incorporated herein by reference in its entirety.

FIELD OF THE INVENTION

The present invention relates generally to semiconductor technology. More particularly, embodiments of the present invention relate to a fin-type bipolar semiconductor device and method of forming the same.

BACKGROUND OF THE INVENTION

As the feature size of metal oxide semiconductor field-effect transistors (MOSFETs) continues to decrease, short channel effects have become a critical design issue due to the reduction in size of the gate length. Fin Field-effect transistors (FinFET) exhibit excellent gate controllability on channel charge and superior electrostatic control capability, so that the feature size of complementary metal oxide semiconductor (CMOS) devices can be further reduced, such as process nodes below 20 nm.

Bipolar junction transistors (BJTs) are one of the most widely used semiconductor devices. A BJT can be implemented by a MOSFET manufacturing process.

The present inventor has discovered that, in the formation of the BJT by the conventional FinFET manufacturing process, etching the fin of a FinFET device may cause defects to the sides of the fin, resulting in a relatively high leakage current. Furthermore, since the emitter of the BJT is in the middle or at the bottom of the fin, the emitter has a relatively smaller surface area, so that the BJT has poor linearity.

As shown in FIG. 1, the area of the emitter (denoted by a dotted circle) is relatively small and the emitter junction may be affected by defects at the fin, so that a thus formed BJT has poor linearity. Furthermore, because each emitter junction area of the fins is relatively small, and the number and distribution of defects are different, resulting in different electric characteristics of the fins and poor uniformity of the electric characteristics of each fin. In actual applications, more than two BJT devices are used together. However, because the fins have different electric characteristics, the respective BJT devices also have different electrical characteristics, resulting in a mismatch of the BJT devices.

Thus, there is a need to provide a novel Fin-type bipolar semiconductor device and manufacturing method thereof to overcome the above-described deficiencies.

BRIEF SUMMARY OF THE INVENTION

The present inventor has discovered that, when forming a BJT transistor using the conventional FinFET manufacturing process, etching the fin of a FinFET device may cause defects to the sides of the fin, resulting in a relatively high leakage current. Furthermore, since the emitter of the BJT is in the middle or at the bottom of the fin, the emitter has a relatively smaller surface area, so that the BJT has poor linearity.

Embodiments of the present invention provide a fin-type bipolar semiconductor device. The fin-type bipolar semiconductor device may include a base region comprising a first portion in a semiconductor substrate and a first semiconductor fin on the adjacent first portion, and a collector region comprising a second portion in the semiconductor substrate and a second semiconductor fin on the adjacent second portion. The second portion is adjacent the first portion. The fin-type bipolar device also includes an emitter region comprising a third region in the semiconductor substrate and a third semiconductor fin on the adjacent third portion. The third portion is adjacent the first portion and forms an emitter junction in the semiconductor substrate. The second portion is not adjacent to the third portion. The first, second, and third semiconductor fins are physically separated from each other.

In one embodiment, the third portion is at least partially surrounded by the first portion. The third portion is disposed on a portion of the first portion.

In one embodiment, the fin-type bipolar semiconductor device further includes a plurality of spacers each filling an air gap between two adjacent semiconductor fins, the spacers include a liner oxide and a filler material.

In one embodiment, the first and second portions form a collector junction in the semiconductor substrate.

In one embodiment, the second portion and the third portion are of a first conductivity type, and the first portion is of a second conductivity type that is different from the first conductivity type.

In one embodiment, the fin-type bipolar semiconductor device also includes a plurality of contact members. Each of the contact members is separately in electrical contact with one of the first semiconductor fin, the second semiconductor fin, and the third semiconductor fin.

Embodiments of the present invention also provide a method for manufacturing a fin-type bipolar semiconductor device. The method may include the following steps:

(a) providing a substrate comprising a first region of a first conductivity type and a second region of a second conductivity type different from the first conductivity type, the second region is adjacent the first region;

(b) etching the substrate to form a third region in the first region, a first set of fins on the third region, a fourth region in the second region, and a second set of fins on the fourth region;

(c) performing a first dopant implantation into a first portion of the second set of fins and a corresponding portion of the fourth region to form an emitter region of the first conductivity type, a remaining portion of the fourth region not being doped by the first implantation forming a base region, the emitter region being adjacent the base region and forming a junction in the fourth region; and (d) performing a second dopant implantation into a second portion of the second set of fins, the second portion being different from the first portion.

In one embodiment, the first dopant implantation comprises an ion beam having an inclination angle in a range of about 7 degrees to 15 degrees relative to a perpendicular direction to a surface of the substrate.

In one embodiment, the first conductivity type is N-type and the second conductivity type is P-type; or, the first conductivity type is P-type and the second conductivity type is N-type.

In one embodiment, the third region in the first region is a collector region and forms with the adjacent base region a collector junction.

In one embodiment, the method also includes forming a hard mask layer on the first region and the second region, and etching the hard mask layer to form a hard mask on the first set of fins and on the second set of fins.

In one embodiment, the method also includes, between steps (c) and (d), a step (e) for performing a third dopant implantation into the first set of fins to form a contact region.

In one embodiment, the first conductivity type is N-type, the second conductivity type is P-type, the first set of fins doped with the third dopant implantation has N+-type conductivity, and the second portion of the second set of fins doped with the second dopant implantation has P+-type conductivity.

In one embodiment, the first conductivity type is P-type, the second conductivity type is N-type, the first set of fins doped with the third dopant implantation has P+-type conductivity, and the second portion of the second set of fins doped with the second dopant implantation has N+-type conductivity.

In one embodiment, the method may also include, between steps (b) and (c), forming a liner oxide on the third region, the first set of fins, the fourth region, and the second set of fins.

In one embodiment, the method may further include, after step (d), forming an interlayer dielectric layer filling an air gap between the fins while exposing a portion of the fins, removing a portion of the liner oxide disposed on the exposed portion of the fins, and forming a plurality of contact members on predetermined fins.

In one embodiment, the method may further include, after step (d), forming an interlayer dielectric layer filling an air gap between the fins while exposing a portion of the fins, and forming a plurality of contact members on predetermined fins.

In one embodiment, the method may further include performing a spike annealing on the substrate.

In one embodiment, the emitter region is at least partially surrounded by the base region. The emitter region is disposed on a portion of the base region.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

Figure 1:
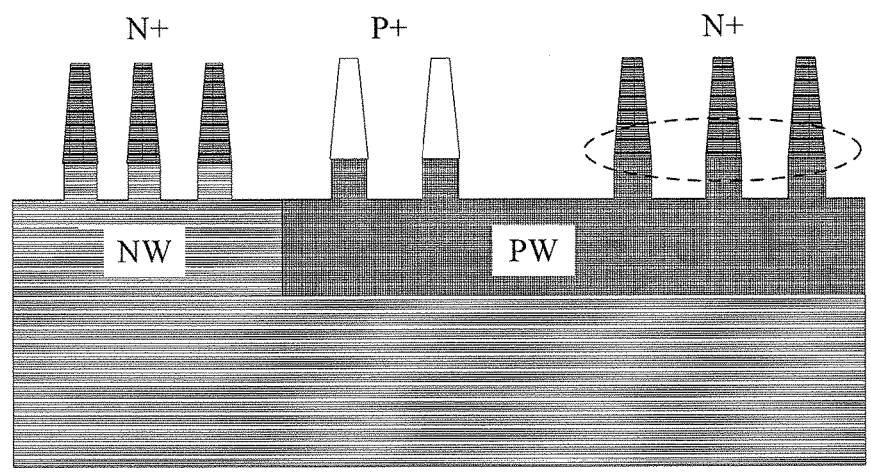
FIG. 1 is a schematic cross-sectional view illustrating a BJT device formed by a conventional FinFET manufacturing process, as known in the prior art.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms such as "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "a", "an" and "the" may include singular and plural references. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The use of the terms first, second, etc. do not denote any order, but rather the terms first, second, etc. are used to distinguish one element from another. Furthermore, the use of the terms a, an, etc. does not denote a limitation of quantity, but rather denote the presence of at least one of the referenced items.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The present invention will now be described more fully herein after with reference to the accompanying drawings, in which preferred embodiments of the invention are shown. This invention may, however, be embodied in many different forms and should not be construed as limited by the embodiments set forth herein. Rather, these embodiments are provided so that this disclosure will be thorough and complete, and will fully convey the scope of the invention to those skilled in the art.

As described above, in the conventional fin-type BJT device, the area of the emitter junction is relatively small and the emitter junction may be affected by the defects at the fin, so that the BJT device thus formed has poor linearity. Furthermore, because each emitter junction area of the fins is relatively small, and the number and distribution of defects are different, that can cause the fins to have different and non-uniform electrical characteristics. In actual applications, more than two BJT devices are used together. However, because the fins have different electrical characteristics, the respective BJT devices also different electrical characteristics, resulting in a mismatch of the BJT devices. The present disclosure describes a novel fin-type bipolar semiconductor device.

Figure 2:
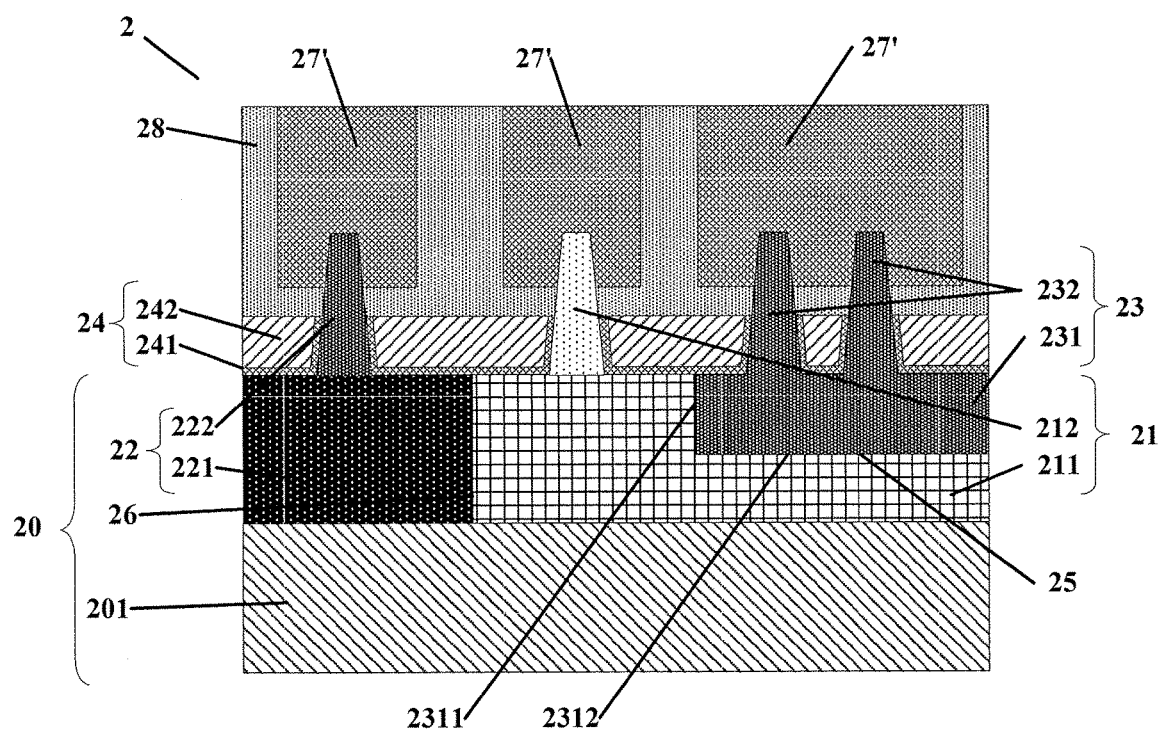
FIG. 2 is a schematic cross-sectional view illustrating a Fin-Type BJT semiconductor device according to embodiments of the present invention.

FIG. 2 is a cross-sectional view illustrating a fin-type bipolar semiconductor device 2 according to embodiments of the present invention. As shown in FIG. 2, the fin-type bipolar semiconductor device 2 includes a base region 21, a collector region 22, and an emitter region 23. The base region 21 includes a first portion 211 in a semiconductor substrate (e.g., a silicon substrate) 20, and a first semiconductor fin 212 disposed adjacently on the first portion 211. The collector region 22 includes a second portion 221 in the semiconductor substrate 20 and a second semiconductor fin 222 disposed adjacently on the second portion 221. The emitter region 23 includes a third portion 231 in the semiconductor substrate 20 and a third semiconductor fin 232 disposed adjacently on the third portion 231. The first portion 211 and the third portion 231 disposed adjacent each other form an emitter junction 25. The emitter junction 25 is located in the semiconductor substrate 20. In addition, the second portion 221 and the third portion 231 are not adjacent to each other. The first semiconductor fin 212, the second semiconductor fin 222, and the third semiconductor fin 232 are physically separate from each other. For example, the first semiconductor fin 212, the second semiconductor fin 222, and the third semiconductor fin 232 can be used as a base, a collector, and an emitter of the fin-type bipolar device, respectively.

In certain embodiments, a base layer 201 is disposed below the base region 21, the collector region 22, and the emitter region 23. The base layer 201 may be of a semiconductor material, which may be an insulation material or the same as or a different material than that of the base region 21, the collector region 22, and the emitter region 23. It is understood that the number of the first semiconductor fin 212, the second semiconductor fin 222, and the third semiconductor fin 232 can be any integer number. In the example shown in FIG. 2, one first semiconductor fin 212, one second semiconductor fin 222, and two third semiconductor fins 232 are used. But it is understood that the number is arbitrary chosen for describing the example embodiment and should not be limiting.

In some embodiments, the third portion 231 may be at least partially surrounded by the first portion 211. FIG. 2 illustrates a cross-sectional view. In reality, the first, second, and third portions each are 3-dimensional structure. For example, the third portion may have a six-sided rectangular structure. In other embodiments, the third portion may have other shapes. In an exemplary embodiment, the third portion has a rectangular shape having 6 surfaces and is disposed on a portion of the first portion 211. In a further exemplary embodiment, the third portion 231 may have at least two surfaces adjacent the first portion 211, so that the third portion 231 is at least partially surrounded by the first portion 211.

In an exemplary embodiment, the left-side surface 2311 and the bottom-side surface 2312 of the third portion 231 each are adjacent the first portion 211, as shown in FIG. 2. In another exemplary embodiment, the left-side surface 2311, the bottom-side surface 2312, the front-side surface (in a direction perpendicular to the paper surface toward the viewer), and the back-side (in a direction perpendicular to the paper surface facing away the viewer) of the third portion 231 each are adjacent the first portion 211. In yet another exemplary embodiment, the left-side surface 2311, the bottom-side surface 2312, the right-side surface (opposite the left-side surface), the bottom-side surface 2312, the front-side surface, and the back-side surface of the third portion 231 each are adjacent the first portion 211. In another exemplary embodiment, the left-side, the right-side, the front-side, and the back-side surfaces of the third portion 231 each are adjacent the first portion 211, and its bottom-side surface is adjacent the base layer 201 of the substrate 20. It will be appreciated by those of skill in the art that, for other shapes of the third portion 231, its surfaces can be adjacent the corresponding surfaces of the first portion 211, and will not be described herein in further detail.

Referring to FIG. 2, the fin-type bipolar semiconductor device may further include a spacer 24 that partially fills the air gaps between the first semiconductor fin 212, the second semiconductor fin 222, and the third semiconductor fin 232. The spacer 24 may include a variety of liner oxide 241 and filler material 242. The spacer is configure to prevent the fins from inadvertently electrically connected to each other to improve the device performance.

Referring still to FIG. 2, the first portion 211 is adjacent the second portion 221 and forms a collector junction 26 in the substrate 20. FIG. 2 shows an embodiment having one collector junction. In other embodiments, similar to the third portion 231, the second portion 221 may also be partially surrounded by the first portion 211. In the embodiment of the second portion 221 being partially surrounded by the first portion 211, exemplary embodiments of the first portion 211 at least partially surrounding the third portion 231 may be used, and complete details will not be provided herein.

In some embodiments, the second portion 221 and the third portion 231 are of the first conductivity type, the first portion 211 is of the second conductivity type that is different from the first conductivity type. Accordingly, the second semiconductor fin 222 and the third semiconductor fin 233 are of the first conductivity type, the first semiconductor fin 221 is of the second conductivity type. Preferably, the first, second, and third semiconductor fins have a doping concentration higher than those of the corresponding first, second and third portions. The first conductivity type may be N-type or N+ type (having different doping concentrations), the second conductivity type may be P-type or P+ type (having different doping concentrations), or vice versa. In some embodiments, the first conductivity type is N-type or N+ type, and the second conductivity type may be P-type or P+ type. In other embodiments, the first conductivity type is P-type or P+ type, and the second conductivity type is N-type or N+ type. The term N+-type refers to a higher concentration of N-type impurities as for example higher than $5\times10^{14}$ atoms per cubic centimeter. The term P+-type refers to a higher concentration of P-type impurities as for example higher than $5\times10^{14}$ atoms per cubic centimeter.

In an exemplary embodiment, the second portion 221 is N-type, the third portion 231 is N+-type, the first portion 211 is P-type, the second semiconductor fin 222 and the third semiconductor fin 232 are N+-type, and the first third semiconductor fin 212 is P+-type. In another exemplary embodiment, the second portion 221 is P-type, the third portion 231 is P+-type, the first portion 211 is N-type, the second semiconductor fin 222 and the third semiconductor fin 232 are P+-type, and the first third semiconductor fin 212 is N+-type In some embodiments, the first conductivity type is N+-type or P+-type. That is, the second portion 221, the third portion 231, the second semiconductor fin 222 and the third semiconductor fin 232 all are N+-type or all are P+-type. Doping of the semiconductor fins heavily with N+ or P+ type will reduce the contact resistance.

Referring still to FIG. 2, the fin-type bipolar device 2 also includes contact members 27' that connect to the first, second and third semiconductor fins 212, 222, and 232, respectively. The contact members 27' are configured to connect to other components (e.g., wiring). The contact members 27' may include, but not limited to, a metal material or an alloy. For example, the contact members 27' may include tungsten, titanium, cobalt, alloys or silicide thereof.

Referring still to FIG. 2, the fin-type bipolar device 2 may further include an interlayer dielectric layer 28 disposed on the spacer 24 and adjacent the fins. The interlayer dielectric layer 28 is configured to prevent inadvertent electrical connection between the fins to improve the device performance. In some embodiments, the interlayer dielectric layer 28 may include one or more insulation materials, such as oxide (e.g., silicon oxide), or nitride (e.g., silicon nitride).

Figure 3:
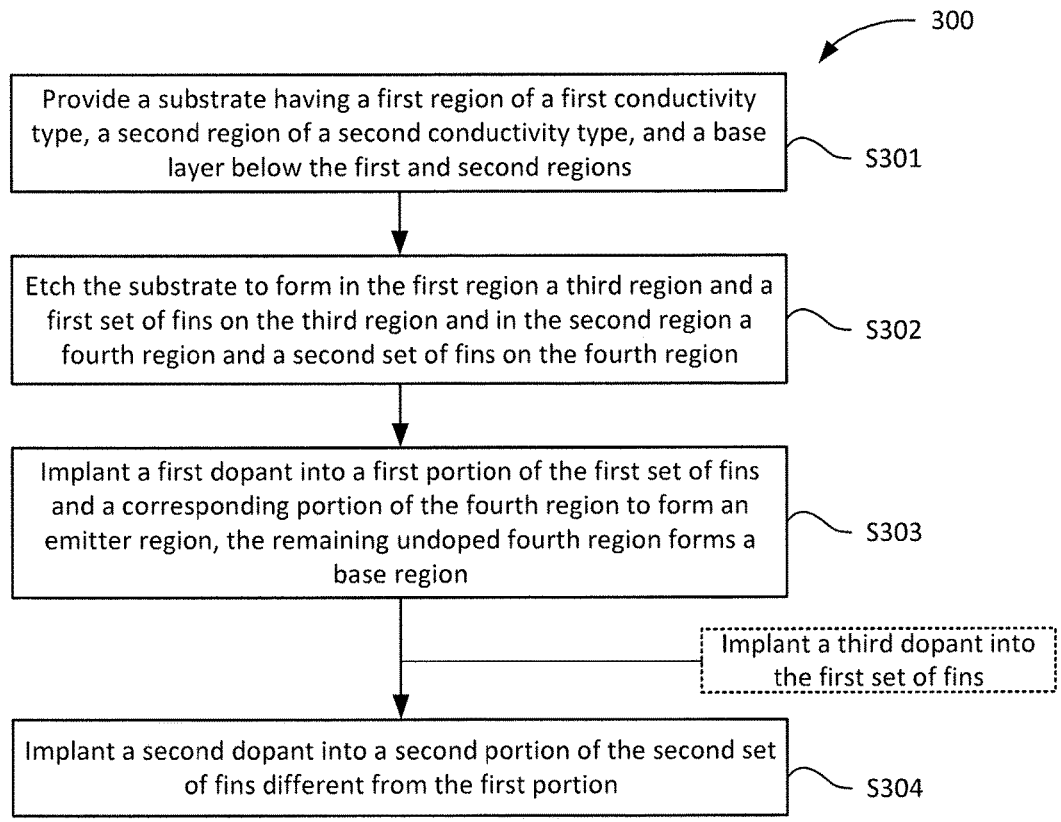
FIG. 3 is a simplified flowchart illustrating methods for manufacturing a semiconductor device according to various embodiments of the present invention.
Figure 4A:
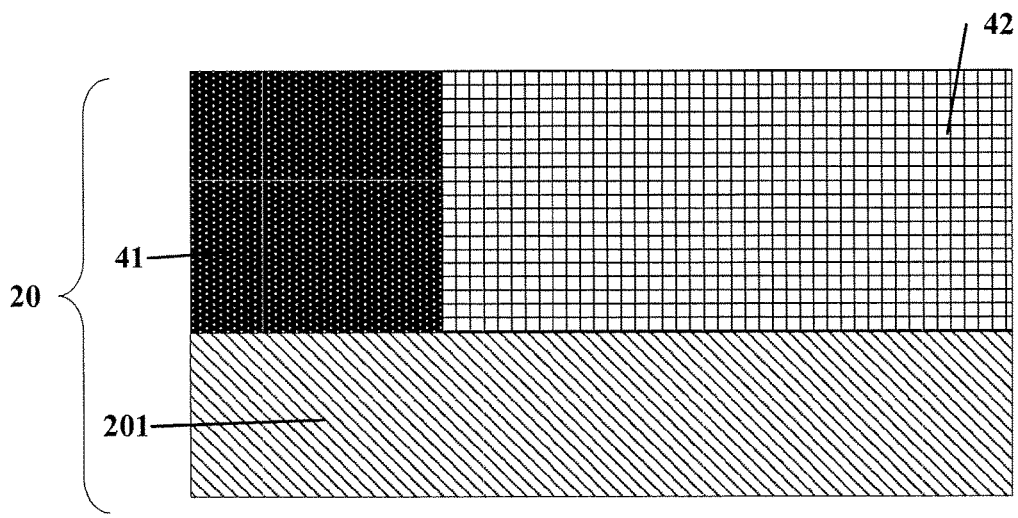
FIG. 4A is a schematic cross-sectional view of a structure illustrating an intermediate step of a method of forming a semiconductor device according to an embodiment of the present invention.

FIG. 3 is a simplified flowchart illustrating methods for manufacturing a semiconductor device according to various embodiments of the present invention. FIGS. 4A through 4G are schematic cross-sectional views of a structure illustrating intermediate steps of a method of forming a fin-type bipolar device according to an embodiment of the present invention. A method 300 for manufacturing a fin-type bipolar device according to an embodiment of the present invention is described below with reference to FIG. 3 and FIGS. 4A through 4G. The Method 300 includes:

S301: providing a substrate comprising a first region of a first conductivity type and a second region of a second conductivity type that is different from the first conductivity type. The second region is adjacent the first region. Referring to FIG. 4A, a substrate (e.g., silicon substrate) 20 includes a first region 41 and a second region 42, the first region and the second region have different semiconductor types. For example, the first region 41 is N-type and the second region is P-type; or the first region 41 is P-type and the second region is N-type. The substrate 20 also includes a base layer 201 below the first and second regions.

Figure 4B:
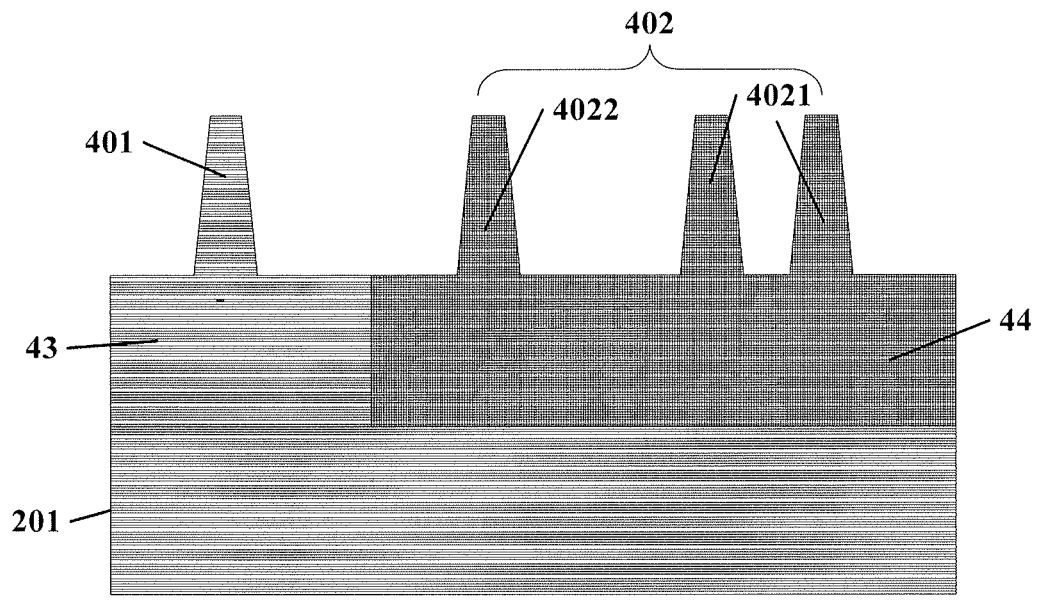
FIG. 4B is a schematic cross-sectional view of a structure illustrating an intermediate step of a method of forming a semiconductor device after etching according to an embodiment of the present invention.

S302: performing an etching process on the substrate to form a third region in the first region and a first set of fins on the third region, and a fourth region in the second region and a second set of fins on the fourth region. Referring to FIG. 4B, the substrate 20 is etched to form a third region 43 and a first set of fins 401, and a fourth region 44 and a second set of fins 402. In some embodiments, the fin-type structure of FIG. 4B may be formed by the following processes: forming a patterned hard mask on the substrate, performing an etching process on the substrate using the patterned hard mask as a barrier layer to form the third region 43 and the first set of fins 401, and the fourth region 44 and the second set of fins 402. In other embodiments, the fin-type structure of FIG. 4B may be formed using a shallow trench isolation (STI) process. It is understood that the number of the fins in the first set and in the second set can be any integer number. In the example shown in FIG. 4B, one fin is shown in the first set of fins, and three fins are shown in the second set of fins. But it is understood that the number is arbitrary chosen for describing the example embodiment and should not be limiting.

Figure 4C:
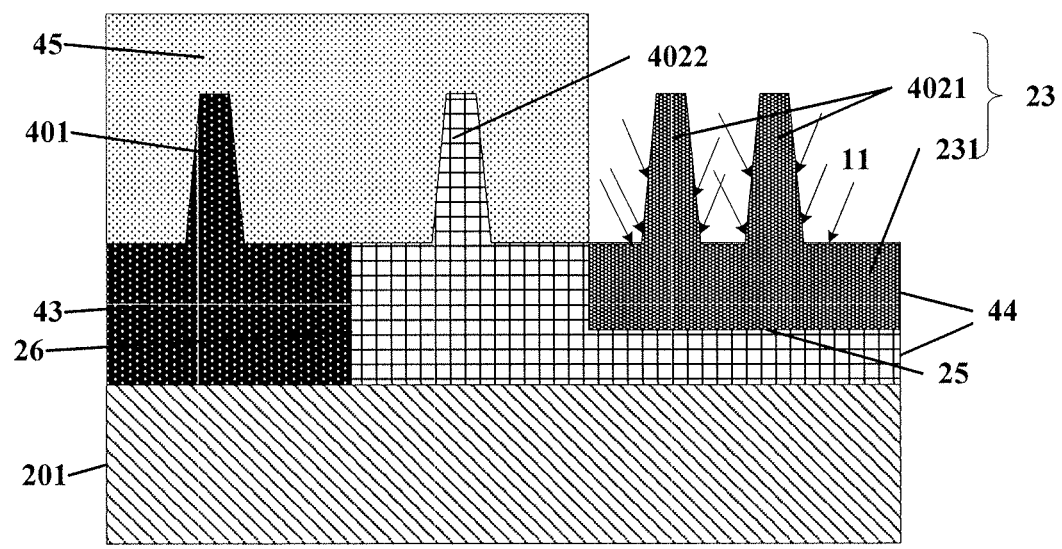
FIG. 4C is a schematic cross-sectional view of a structure illustrating an intermediate step of a method of forming a semiconductor device with a first dopant implantation according to an embodiment of the present invention.
Figure 4D:
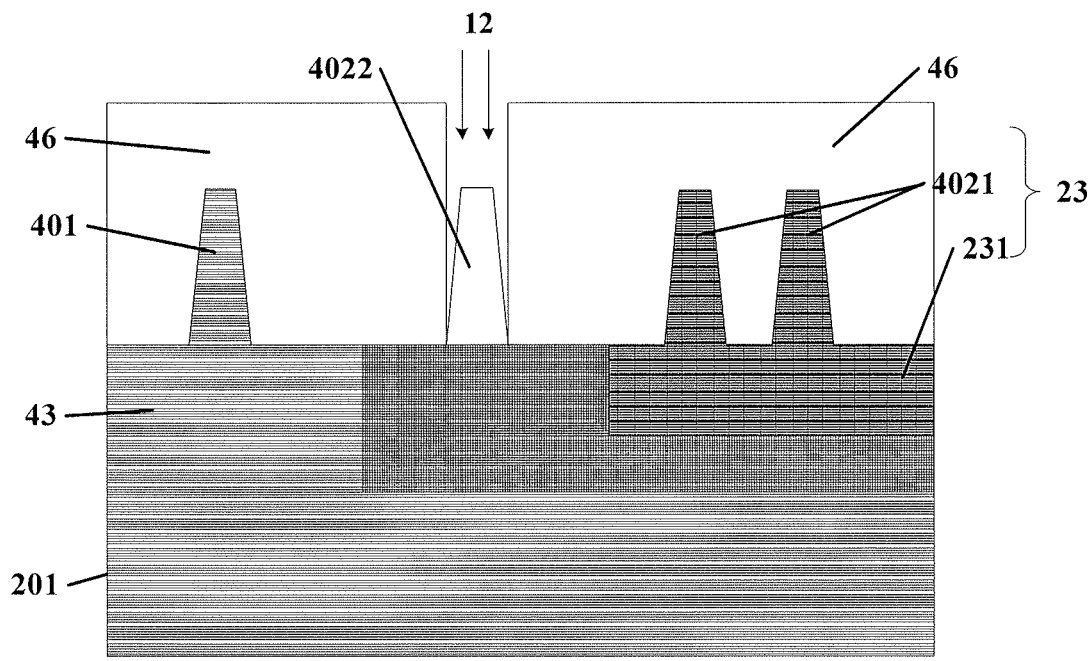
FIG. 4D is a schematic cross-sectional view of a structure illustrating an intermediate step of a method of forming a semiconductor device with a second dopant implantation according to an embodiment of the present invention.
Figure 4E:
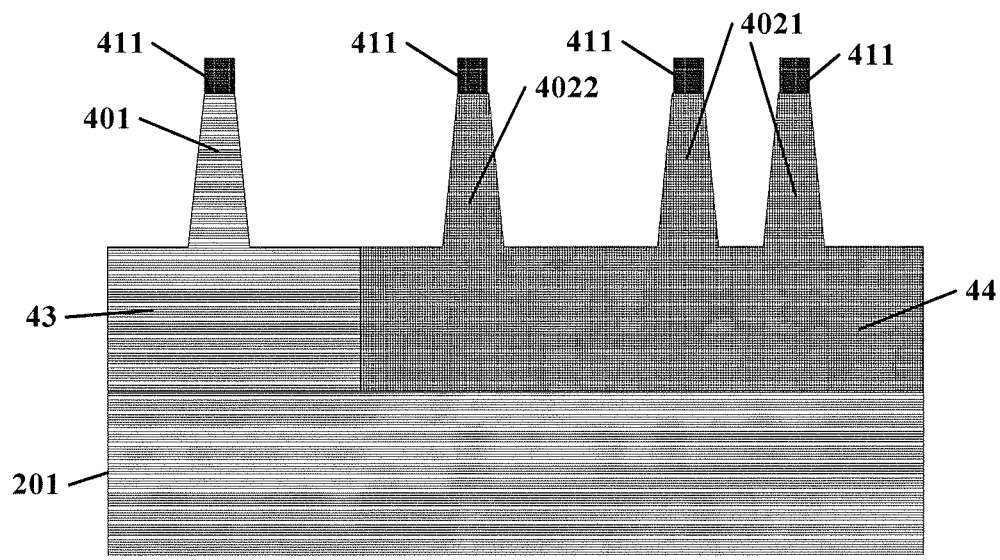
FIG. 4E is a schematic cross-sectional view of a structure illustrating an intermediate step of a method of forming a semiconductor device after forming a hard mask according to an embodiment of the present invention.
Figure 4F:
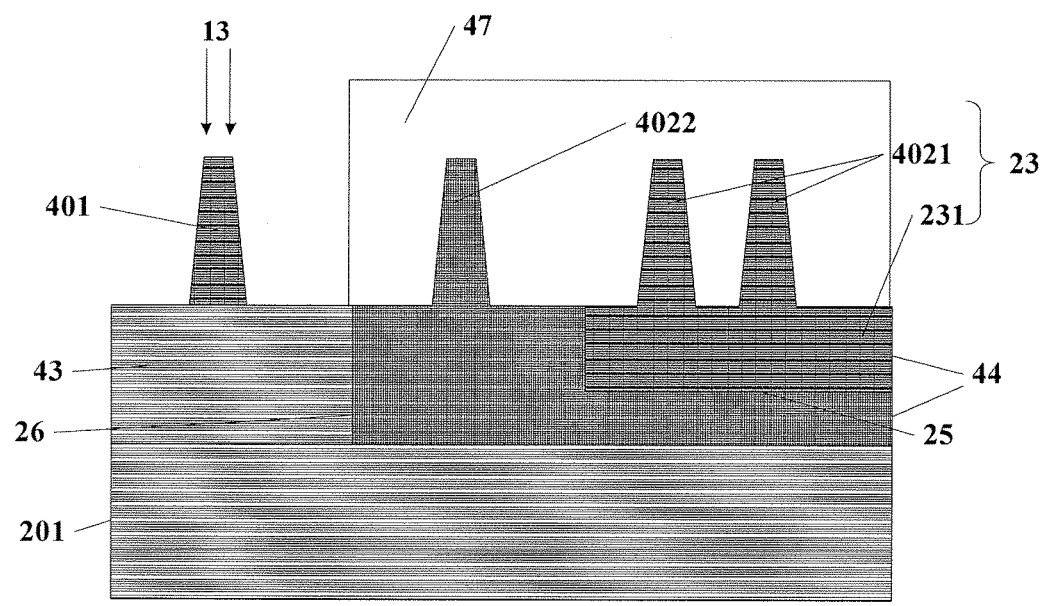
FIG. 4F is a schematic cross-sectional view of a structure illustrating an intermediate step of a method of forming a semiconductor device with a third dopant implantation according to an embodiment of the present invention.

In some embodiments, the substrate also includes a hard mask layer (not shown) on the first and second regions, so that etching the substrate forms a hard mask 411 on the first and second sets of fins, as shown in FIG. 4E. In some embodiments, the hard mask 411 may be silicon nitride. In a subsequent step, the hard mask 411 may be removed.

S303: performing a first dopant implantation 11 into a first portion of the second set of fins and a corresponding portion of the fourth region to form an emitter region of a first conductivity type, and the remaining portion of the fourth region not doped by the first dopant implantation is a base region. The base region is adjacent the emitter region. The junction between the base region and the emitter region is within the fourth region. For example, as shown in FIG. 4C, a first dopant implantation 11 is performed on a portion 4021 of the first set of fins 402 and a corresponding portion 231 of the fourth region using a patterned mask (e.g., photoresist) 45, which covers portions of the structure that needs not be doped. The emitter region is thus formed. Thereafter, the hard mask 45 is removed. In some embodiments, the first dopant implantation is performed at an inclination (tilt) angle, which is defined as the angle between the incident ion beam and the normal direction (i.e., direction perpendicular to the surface of the substrate). In a preferred embodiment, the inclination angle may be between 7 degrees and 15 degrees, such as 10 degrees, 12 degrees, etc. In other embodiments, the implantation process can be other processes, such as a diffusion process. The doped portion 4021 may correspond to the third semiconductor fin 232 of FIG. 2, and is in electrical contact with the emitter electrode. Referring to FIG. 4C, the emitter region is adjacent the base region. The interface at the junction (labeled 25) between the base region and the emitter region is within the fourth region 44. In some embodiments, the emitter region is at least partially surrounded by the base region. In other embodiments, the emitter region is disposed on a portion of the base region.

The etched first region (the third region 43 and the first set of fins 401) may be used as a collector region. The collector region is adjacent the base region and forms a junction 26 with the base region below the first set of fins 401. Of course, those of skill in the art will appreciate that the collector region can be at least partially surrounded by the base region to increase the junction surface, according to some embodiments.

In certain embodiments, the first conductivity type is N-type, and the second conductivity type is P-type. The first dopant implementation process may be performed with arsenic at an energy of 8 keV to 20 keV (e.g., 10 keV, 13 keV, 17 keV, etc) and with a doping concentration in the range between $1.0 \times 10^{14}$ atoms/cm$^3$ and $2.0 \times 10^{15}$ atoms/cm$^3$ (e.g., $5.0 \times 10^{14}$ atoms/cm$^3$, $1.0 \times 10^{15}$ atoms/cm$^3$, $1.5 \times 10^{15}$ atoms/cm$^3$, etc.).

In other embodiments, the first conductivity type is P-type, and the second conductivity type is N-type. The first dopant implementation process may include boron fluoride (the implanted ions are boron fluoride ions) and be performed at an energy of 3 keV to 10 keV (e.g., 5 keV, 7 keV, 9 keV, etc) and with a doping concentration in the range between $1.0 \times 10^{14}$ atoms/cm$^3$ and $2.0 \times 10^{15}$ atoms/cm$^3$ (e.g., $5.0 \times 10^{14}$ atoms/cm$^3$, $1.0 \times 10^{15}$ atoms/cm$^3$, $1.5 \times 10^{15}$ atoms/cm$^3$, etc.); or, the first dopant implementation process may include boron fluoride (the implanted ions are boron ions) and be performed at an energy of about 1 keV to about 4 keV (e.g., 2 keV, 3 keV, etc), and with a doping concentration in the range between $1.0 \times 10^{14}$ atoms/cm$^3$ and $3.0 \times 10^{15}$ atoms/cm$^3$ (e.g., $8.0 \times 10^{14}$ atoms/cm$^3$, $1.0 \times 10^{15}$ atoms/cm$^3$, $2.0 \times 10^{15}$ atoms/cm$^3$, etc.).

S304: performing a second dopant implantation 12 into a second portion of the second set of fins (the second portion is different from the first portion of the second set of fins).

For example, as shown in FIG. 4D, the second dopant implantation 12 is performed into a second portion 4022 of the second set of fins 402 using a patterned mask (e.g., photoresist) 46, which covers portions of the structure that needs not be doped. The patterned mask 46 is then removed. The second implantation may be an ion implantation or a diffusion implantation.

Thus, embodiments of the present invention provide a fin-type bipolar semiconductor device. Since the emitter junction interface is formed in the semiconductor substrate, and the surface area of the emitter junction is relatively large, there is no defects present in the emitter junction, so that the fin-type bipolar semiconductor device has a relatively small leakage current and an improved uniform linearity and electrical characteristics. The fin-type bipolar semiconductor devices formed with the present invention can be easily matched with one another.

In some embodiments, the method may also include, between S303 and S304, performing a third dopant implantation process (denoted as a dotted box in FIG. 3) into the first set of fins 401 to form a contact region. For example, referring to FIG. 4F, the third implantation 13 is performed into the first set of fins 401 using a patterned mask 47 to cover portions that do not need the third implantation. The third implantation can be an ion implantation or a diffusion, Thereafter, the mask 47 is removed.

In some embodiments, the second dopant implantation is an ion implantation, and the third dopant implantation is an ion implantation. The first conductivity type is N-type, and the second conductivity type is P-type. In an exemplary embodiment, the conductivity type of the third ion implementation into the first set of fins is N+-type, and the conductivity type of the second ion implantation into the second set of fins is P+-type. In an exemplary embodiment, the third ion implantation includes arsenic and is performed at an energy of 2 keV to 7 keV (e.g., 3 keV, 5 keV, etc), and with a doping concentration in the range between $5.0 \times 10^{14}$ atoms/cm$^3$ and $3.0 \times 10^{15}$ atoms/cm$^3$ (e.g., $1.0 \times 10^{15}$ atoms/cm$^3$, $2.0 \times 10^{15}$ atoms/cm$^3$, etc.). In another exemplary embodiment, the third ion implantation includes phosphorous and is performed at an energy of 1 keV to 5 keV (e.g., 2 keV, 4 keV, etc) and with a doping concentration in the range between $5.0 \times 10^{14}$ atoms/cm$^3$ and $3.0 \times 10^{15}$ atoms/cm$^3$ (e.g., $1.0 \times 10^{15}$ atoms/cm$^3$, $2.0 \times 10^{15}$ atoms/cm$^3$, etc.). In yet another exemplary embodiment, the second ion implantation includes boron fluoride (the implanted impurity ions are boron fluoride ions) and is performed at an energy of 4 keV to 8 keV (e.g., 5 keV, 7 keV, etc) and with a doping concentration in the range between $5.0 \times 10^{14}$ atoms/cm$^3$ and $3.0 \times 10^{15}$ atoms/cm$^3$ (e.g., $1.0 \times 10^{15}$ atoms/cm$^3$, $2.0 \times 10^{15}$ atoms/cm$^3$, etc.). In other exemplary embodiment, the second ion implantation includes boron fluoride (the implanted impurity ions are boron ions) and is performed at an energy of 1 keV to 4 keV (e.g., 2 keV, 3 keV, etc) and with a doping concentration in the range between $5.0 \times 10^{14}$ atoms/cm$^3$ and $3.0 \times 10^{15}$ atoms/cm$^3$ (e.g., $1.0 \times 10^{15}$ atoms/cm$^3$, $2.0 \times 10^{15}$ atoms/cm$^3$, etc.).

In yet other embodiments, the second dopant implantation is an ion implantation, and the third dopant implantation is an ion implantation. The first conductivity type is P-type, and the second conductivity type is N-type. In an exemplary embodiment, the conductivity type of the third ion implementation into the first set of fins is P+-type, and the conductivity type of the second ion implantation into the second set of fins is N+-type. In an exemplary embodiment, the third ion implantation includes boron fluoride (the implanted impurity ions are boron fluoride ions) and is performed at an energy of 4 keV to 8 keV (e.g., 5 keV, 7 keV, etc.) and with a doping concentration in the range between $5.0 \times 10^{14}$ atoms/cm$^3$ and $3.0 \times 10^{15}$ atoms/cm$^3$ (e.g., $1.0 \times 10^{15}$ atoms/cm$^3$, $2.0 \times 10^{15}$ atoms/cm$^3$, etc.). In another exemplary embodiment, the third ion implantation includes boron fluoride (the implanted impurity ions are boron ions) and is performed at an energy of 1 keV to 4 keV (e.g., 2 keV, 3 keV, etc) and with a doping concentration in the range between $5.0 \times 10^{14}$ atoms/cm$^3$ and $3.0 \times 10^{15}$ atoms/cm$^3$ (e.g., $1.0 \times 10^{15}$ atoms/cm$^3$, $2.0 \times 10^{15}$ atoms/cm$^3$, etc.). In yet another exemplary embodiment, the second ion implantation includes arsenic and is performed at an energy of 2 keV to 7 keV (e.g., 3 keV, 5 keV, etc) and with a doping concentration in the range between $5.0 \times 10^{14}$ atoms/cm$^3$ and $3.0 \times 10^{15}$ atoms/cm$^3$ (e.g., $1.0 \times 10^{15}$ atoms/cm$^3$, $2.0 \times 10^{15}$ atoms/cm$^3$, etc.). In other exemplary embodiment, the second ion implantation includes phosphorous and is performed at an energy of 1 keV to 5 keV (e.g., 2 keV, 4 keV, etc) and with a doping concentration in the range between $5.0 \times 10^{14}$ atoms/cm$^3$ and $3.0 \times 10^{15}$ atoms/cm$^3$ (e.g., $1.0 \times 10^{15}$ atoms/cm$^3$, $2.0 \times 10^{15}$ atoms/cm$^3$, etc.).

In some embodiments, the method may also include, between S302 and S303, forming a first liner oxide 241 on the third region, the first set of fin, the fourth region and the second set of fins. The first liner oxide covers the third region, the first set of fins, the fourth region, and the second set of fins.

Figure 4G:
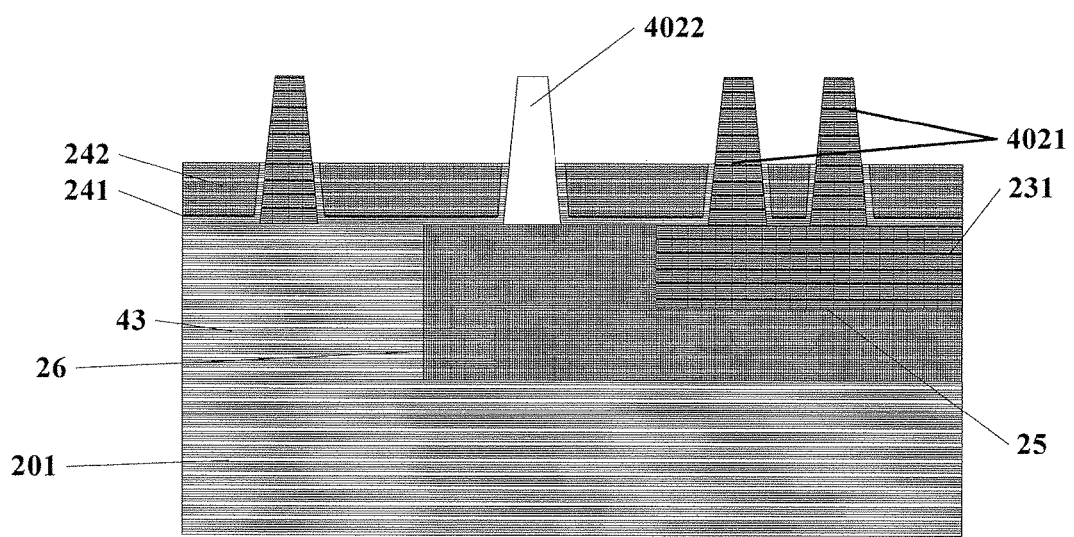
FIG. 4G is a schematic cross-sectional view of a structure illustrating an intermediate step of a method of forming a semiconductor device after forming an interlayer dielectric layer according to an embodiment of the present invention.

In some embodiments, the method also include, after S304, forming an interlayer dielectric layer 242 filling the air gaps between the fins and exposing a portion of the fins, as shown in FIG. 4G. Alternatively, any hard mask will be removed, if present. The method further includes forming contact members at selected locations, as shown in FIG. 2.

In some embodiments, the method also include, after S304, forming a first interlayer dielectric layer 242 filling the air gaps between the fins and exposing an upper portion of the fins, removing a portion of the first liner oxide 241 disposed above the exposed upper portion of the fins, and removing any hard mask, if present, as shown in FIG. 4G. The method also includes forming contact members at selected locations, as shown in FIG. 2.

Figure 5A:
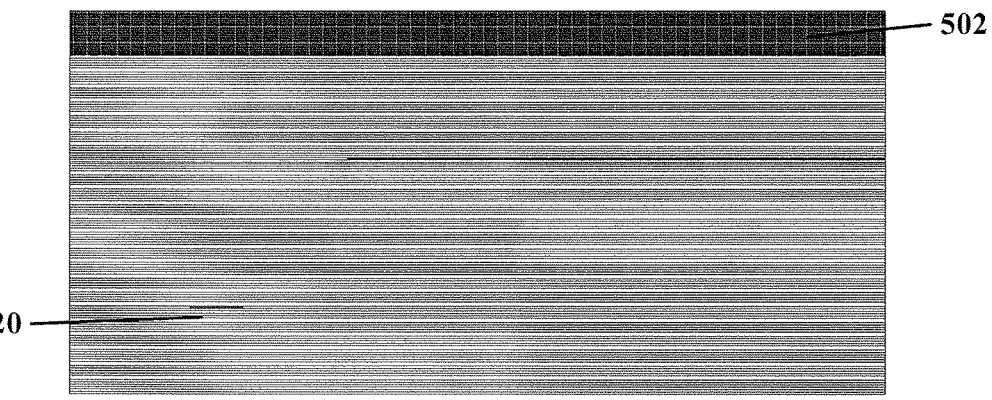
FIG. 5A is a schematic cross-sectional view of a structure illustrating an intermediate step of a method of forming a semiconductor device according to an embodiment of the present invention.
Figure 5B:
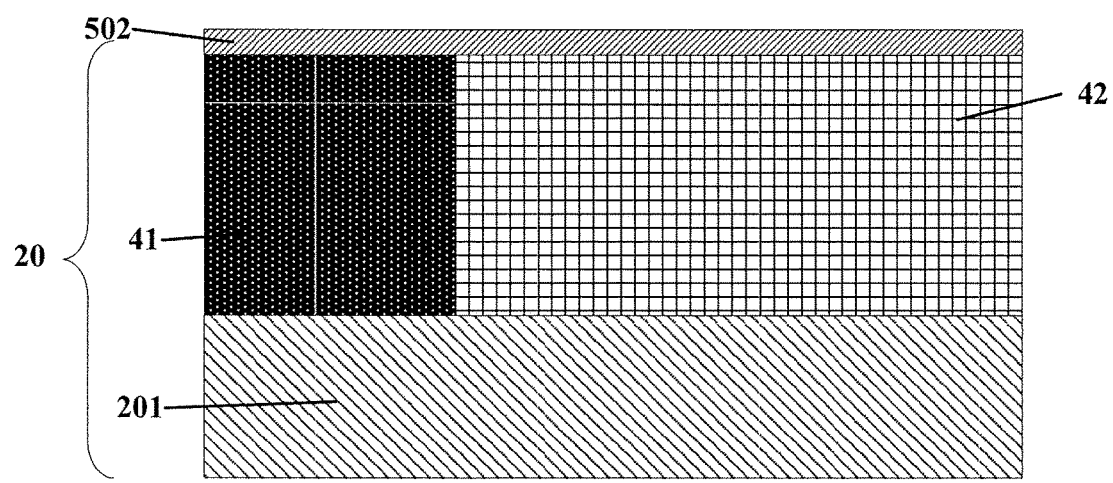
FIG. 5B is a schematic cross-sectional view of a structure illustrating an intermediate step of a method of forming a semiconductor device after a dopant implantation according to an embodiment of the present invention.
Figure 5C:
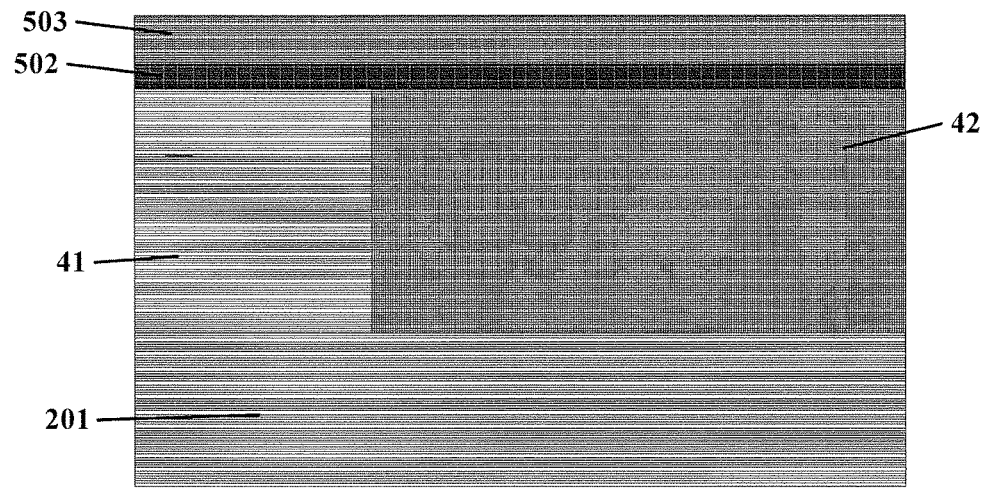
FIG. 5C is a schematic cross-sectional view of a structure illustrating an intermediate step of a method of forming a semiconductor device after forming a hard mask layer according to an embodiment of the present invention.
Figure 5D:
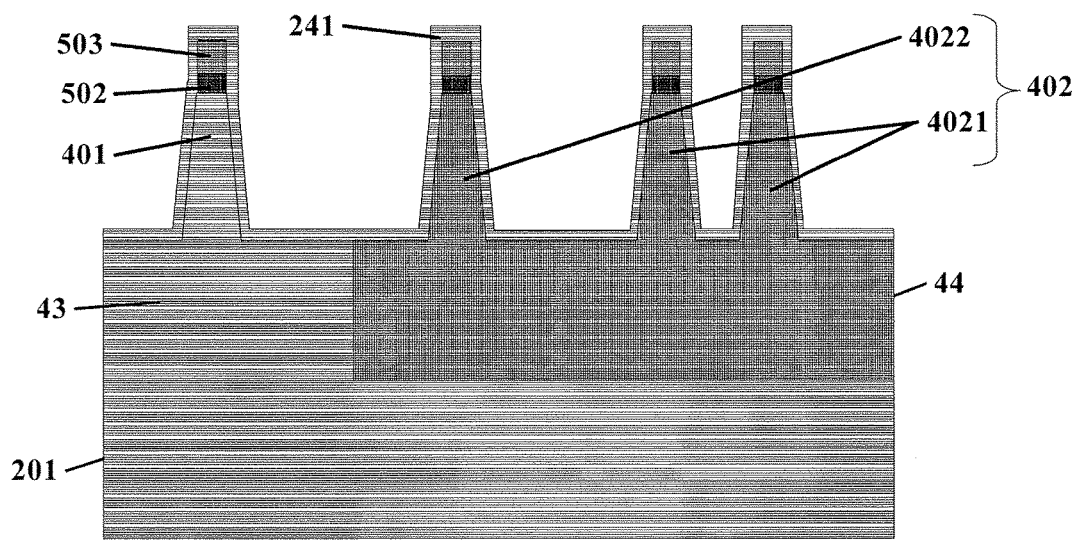
FIG. 5D is a schematic cross-sectional view of a structure illustrating an intermediate step of a method of forming a semiconductor device after an etching process according to an embodiment of the present invention.
Figure 5E:
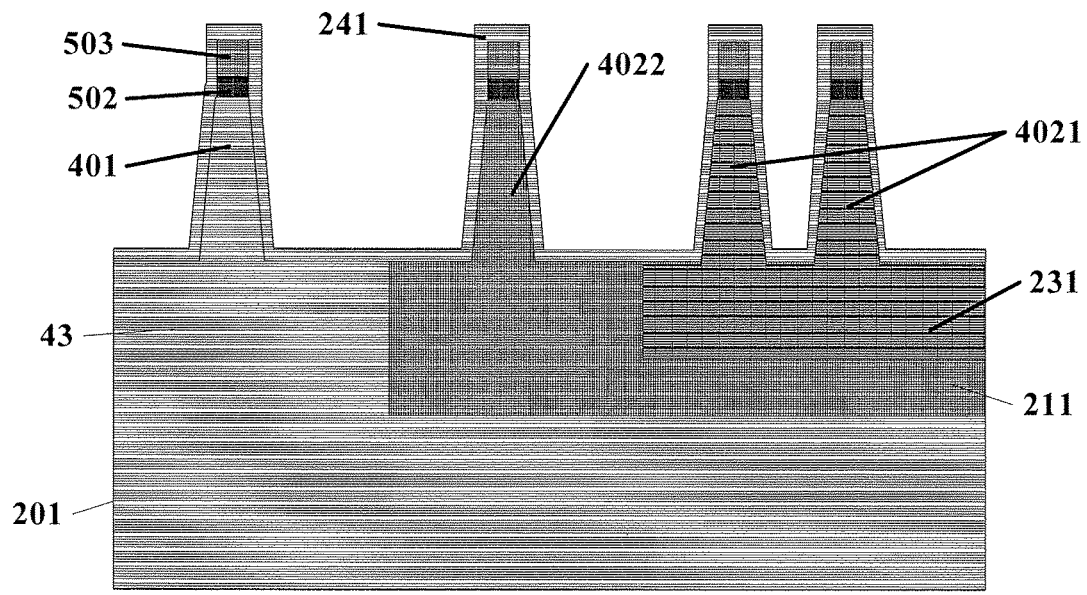
FIG. 5E is a schematic cross-sectional view of a structure illustrating an intermediate step of a method of forming a semiconductor device after a first dopant implantation according to an embodiment of the present invention.
Figure 5F:
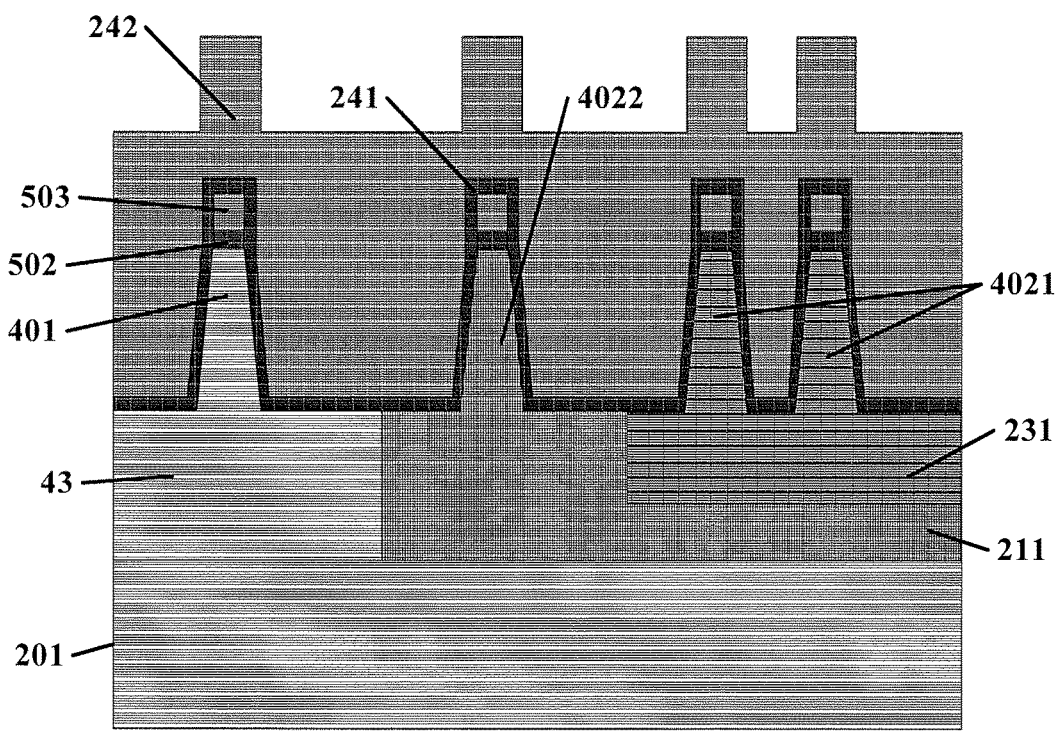
FIG. 5F is a schematic cross-sectional view of a structure illustrating an intermediate step of a method of forming a semiconductor device after forming an interlayer dielectric layer according to an embodiment of the present invention.
Figure 5G:
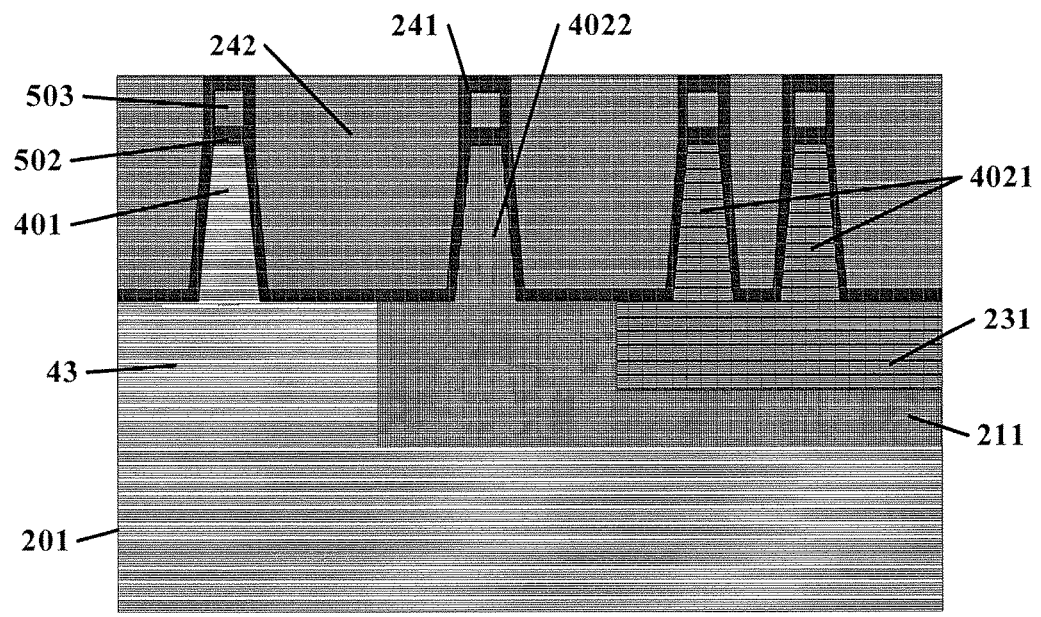
FIG. 5G is a schematic cross-sectional view of a structure illustrating an intermediate step of a method of forming a semiconductor device after planarizing the interlayer dielectric layer according to an embodiment of the present invention.
Figure 5H:
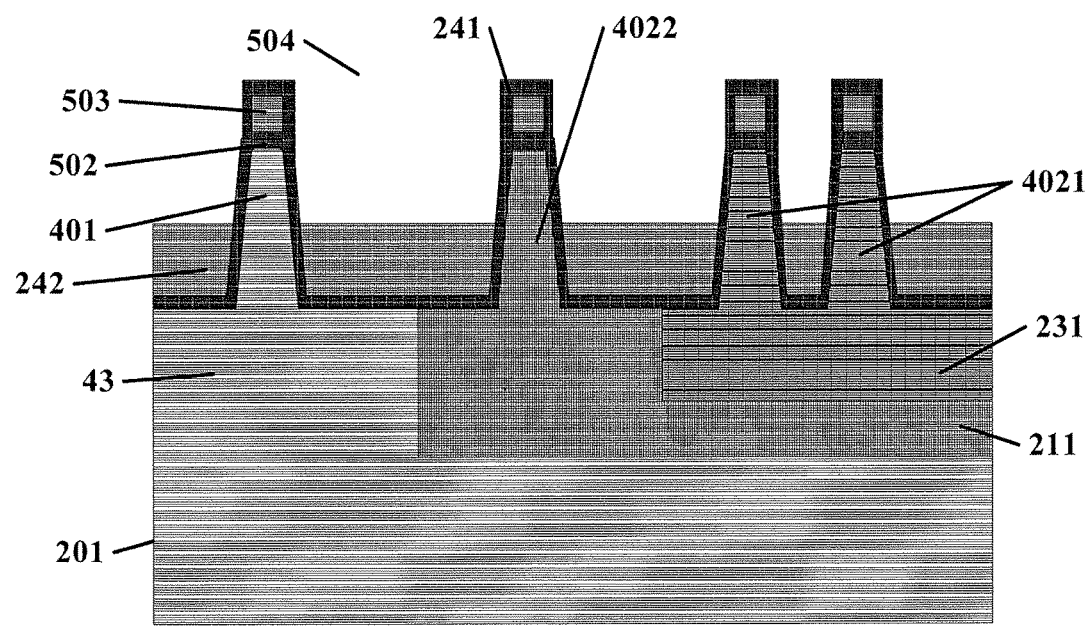
FIG. 5H is a schematic cross-sectional view of a structure illustrating an intermediate step of a method of forming a semiconductor device after etching according to an embodiment of the present invention.
Figure 5I:
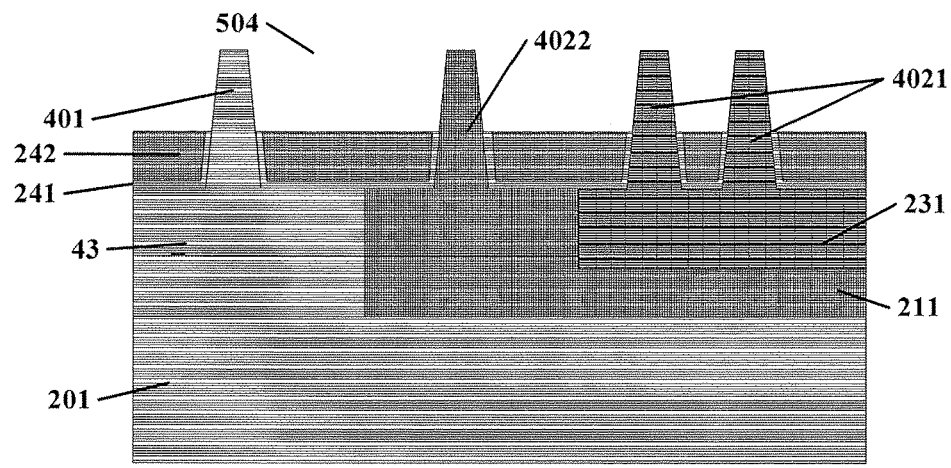
FIG. 5I is a schematic cross-sectional view of a structure illustrating an intermediate step of a method of forming a semiconductor device after removal of the sacrificial layer according to an embodiment of the present invention.
Figure 5J:
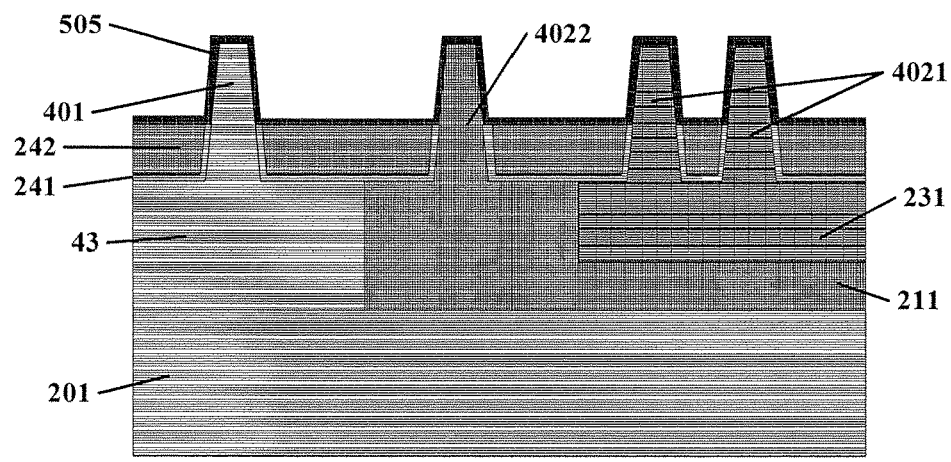
FIG. 5J is a schematic cross-sectional view of a structure illustrating an intermediate step of a method of forming a semiconductor device after forming a liner oxide according to an embodiment of the present invention.
Figure 5K:
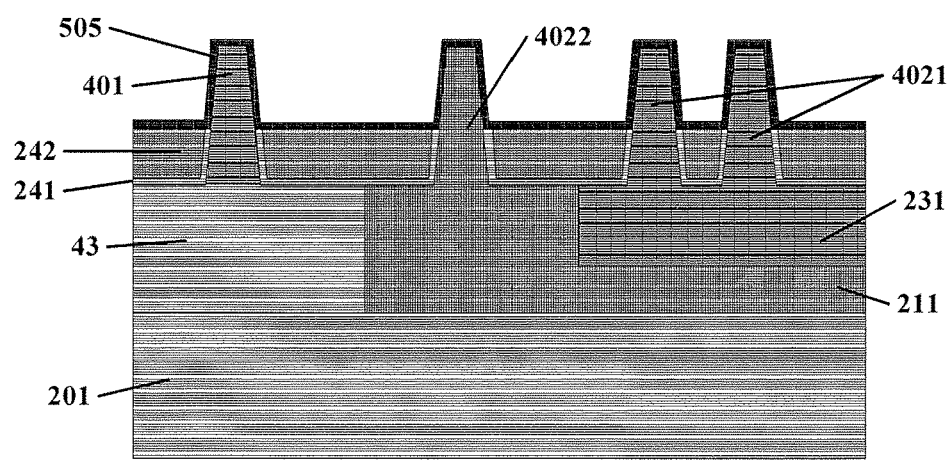
FIG. 5K is a schematic cross-sectional view of a structure illustrating an intermediate step of a method of forming a semiconductor device after a third dopant implantation according to an embodiment of the present invention.
Figure 5L:
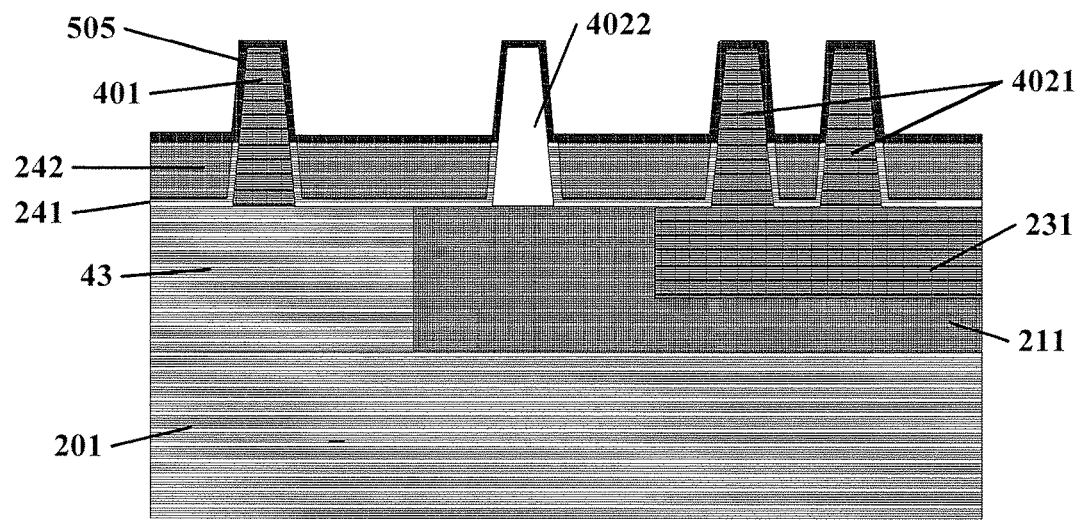
FIG. 5L is a schematic cross-sectional view of a structure illustrating an intermediate step of a method of forming a semiconductor device after a second dopant implantation according to an embodiment of the present invention.
Figure 5M:
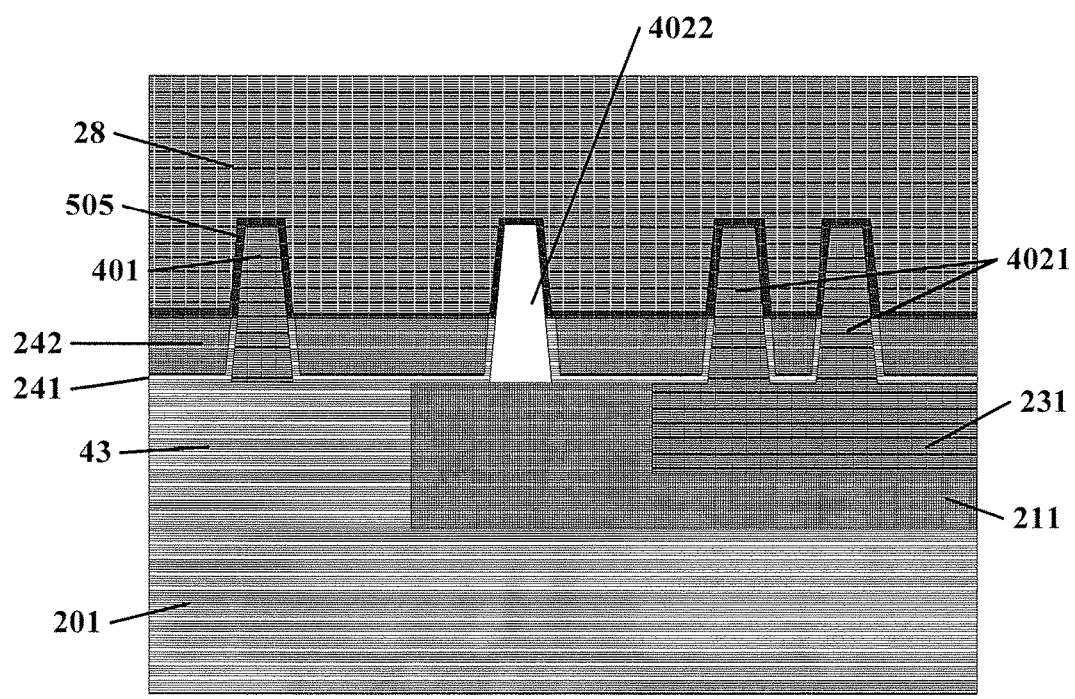
FIG. 5M is a schematic cross-sectional view of a structure illustrating an intermediate step of a method of forming a semiconductor device after forming an interlayer dielectric layer according to an embodiment of the present invention.
Figure 5N:
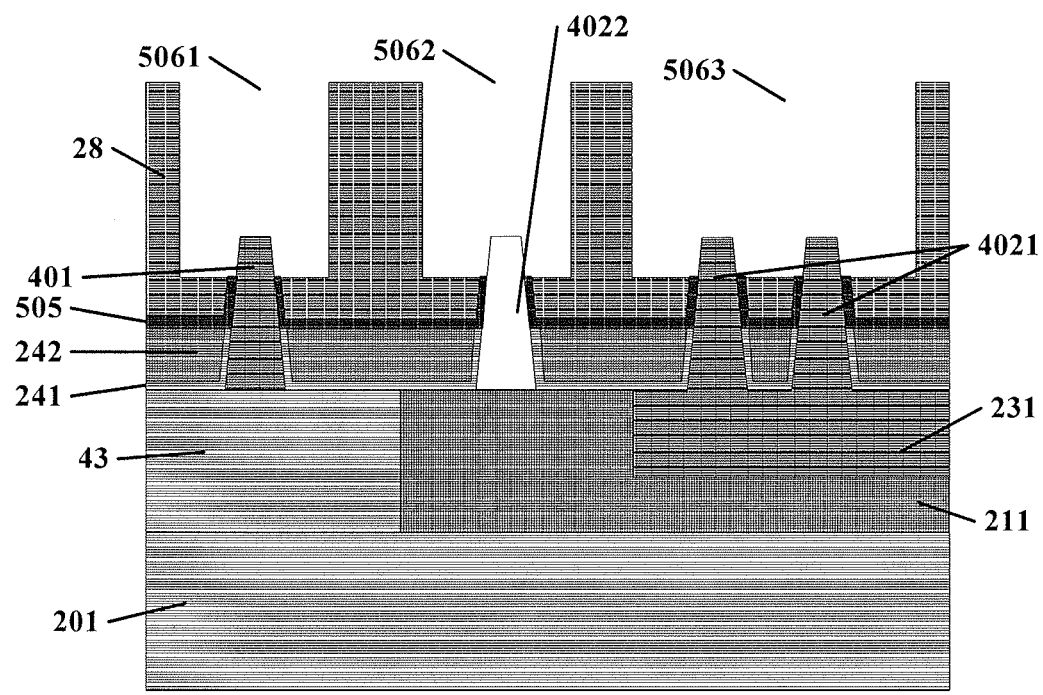
FIG. 5N is a schematic cross-sectional view of a structure illustrating an intermediate step of a method of forming a semiconductor device after selectively etching of the interlayer dielectric layer according to an embodiment of the present invention.
Figure 5O:
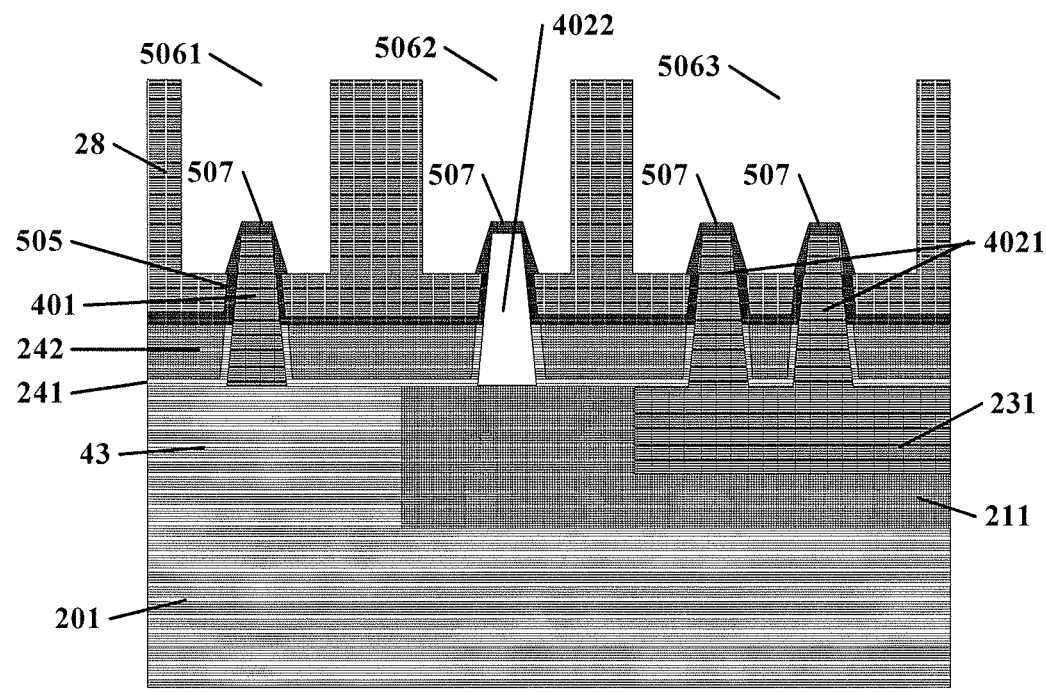
FIG. 5O is a schematic cross-sectional view of a structure illustrating an intermediate step of a method of forming a semiconductor device after forming a metal silicide according to an embodiment of the present invention.
Figure 5P:
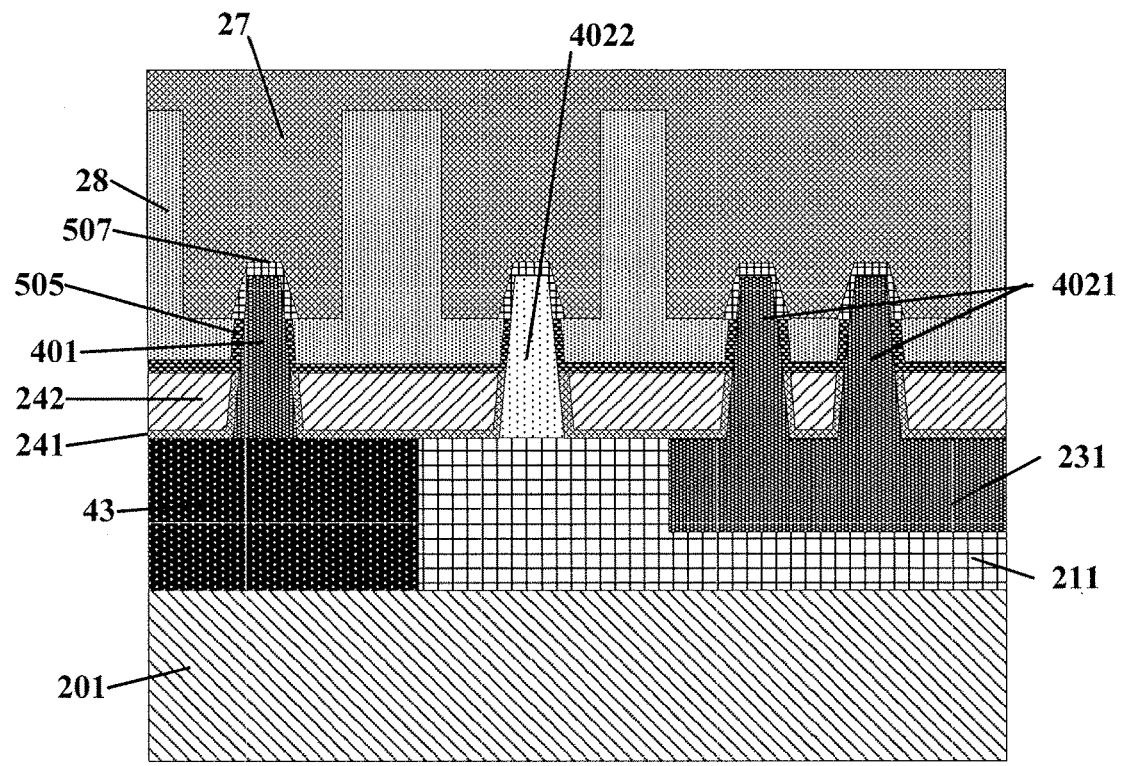
FIG. 5P is a schematic cross-sectional view of a structure illustrating an intermediate step of a method of forming a semiconductor device after forming a metal layer according to an embodiment of the present invention.
Figure 5Q:
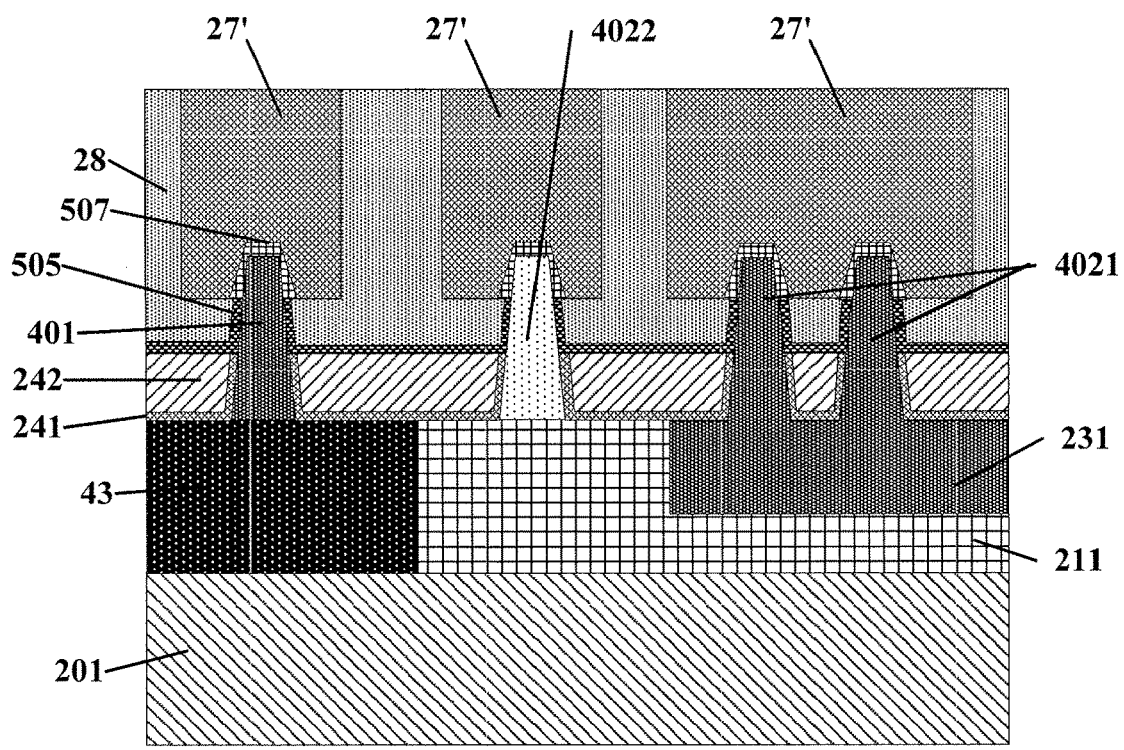
FIG. 5Q is a schematic cross-sectional view of a structure illustrating an intermediate step of a method of forming a semiconductor device after planarization according to an embodiment of the present invention.

FIGS. 5A through 5Q are schematic cross-sectional views of a structure illustrating intermediate steps of a method for manufacturing a fin-type bipolar device according to another embodiment of the present invention.

Referring to FIG. 5A, a substrate 20, e.g., a semiconductor substrate, is provided. A sacrificial oxide (e.g., silicon oxide) 502 is formed on the substrate 20.

Next, referring to FIG. 5B, a dopant implantation is performed into the substrate to form a first region 41 of a first conductivity type and a second region 42 of a second conductivity type different from the first conductivity type. For example, a first mask is formed on the sacrificial oxide 502 to cover the second region. The first mask can be a photoresist configured to be a barrier layer. An ion implantation process is performed into the uncovered portion of the substrate to form the first region, the first mask is then removed. A second mask as a barrier layer is formed on the sacrificial layer 502 to cover the first region, another ion implantation is performed into the portion not covered by the second mask to form the second region, then the second mask is removed. The first region of the first conductivity type and the second region of the second conductivity type are thus formed. The substrate may include an optional base layer 201 below the first and second regions, as shown in FIG. 5B.

In some embodiments, the first conductivity type is N-type, and the second conductivity type is P-type; or, the first conductivity type is P-type, and the second conductivity type is N-type. In an exemplary embodiment, the N-type doped first region or the N-type doped second region can be formed by an ion implantation process including phosphorus at an energy of 100 keV to 180 keV (e.g., 130 keV, 150 keV, etc), and with a doping concentration in the range between $5.0\times10^2$ atoms/cm$^3$ and $5.0\times10^3$ atoms/cm$^3$ (e.g., $1.0\times10^3$ atoms/cm$^3$, $3.0\times10^3$ atoms/cm$^3$, etc.). In another exemplary embodiment, the P-type doped second region or the P-type doped first region can be formed by an ion implantation process including boron at an energy of 30 keV to 70 keV (e.g., 40 keV, 50 keV, 60 keV, etc) and with a doping concentration in the range between $5.0\times10^{12}$ atoms/cm$^3$ and $1.0\times10^{14}$ atoms/cm$^3$ (e.g., $1.0\times10^{13}$ atoms/cm$^3$, $5.0\times10^{13}$ atoms/cm$^3$, etc Next, an annealing treatment is performed to the first and second regions. For example, the annealing treatment can be a rapid thermal annealing (RTA) at a temperature in the range between 950° C. and 1050° C., and a time duration in the range between 5 seconds and 20 seconds. The impurities doped in the first and second regions are activated by the annealing treatment.

Next, referring to FIG. 5C, a hard mask layer (e.g., silicon oxide) 503 is deposited on the sacrificial layer 502.

Next, referring to FIG. 5D, an etching process is performed onto the substrate to form a third region 43 in the first region and a first set of fins 401 on the third region, and a fourth region 44 in the second region and a second set of fins 402 on the fourth region. The second set of fins 402 includes a first group of fins 4021 and a second group of fins 4022. The etching process also forms a hard mask 503 on the first set and second set of fins.

Next, referring to FIG. 5E, a first dopant implantation is performed into the first group 4021 of the second set of fins and the corresponding first portion 231 of the fourth region to form an emitter region of the first conductivity type. The remaining portion of the fourth portion is the base region (i.e., region 211 and the second group of fins 4022). The doped first group of fins 4021 corresponds to the third semiconductor fin 232 of FIG. 2 and is in electrical contact to an emitter electrode.

Next, referring to FIG. 5F, an interlayer dielectric layer 242 is formed on the fins and in the air gaps between the fins. For example, the interlayer dielectric layer 242 is formed by a flowable chemical vapor deposition (FCVD) process. The interlayer dielectric layer 242, e.g., silicon oxide, is used as a filler.

Next, referring to FIG. 5G, a planarization process is performed on the interlayer dielectric layer 242. In an exemplary embodiment, the planarization process is performed using a chemical mechanical polishing (CMP) process to remove a portion of the interlayer dielectric layer 242 using the liner oxide 241 as a stop layer for planarization. In another exemplary embodiment, the hard mask 503 may be used as a stop layer for planarization.

Next, referring to FIG. 5H, a portion of the interlayer dielectric layer 242 is removed by etching to form a groove 504 and expose a portion of the fins.

Next, referring to Figure SI, the hard mask 503 and the exposed portion of the liner oxide 241 are removed by etching. In the embodiment, the sacrificial layer 502 is also removed.

Next, referring to FIG. 5J, a second liner oxide 505 (e.g., silicon dioxide) is deposited on the first interlayer dielectric layer 242 and the exposed portion of the fins to repair the surface of the fins after etching.

Next, referring to FIG. 5K, a third dopant implantation is performed into the first set of fins 401 to form a contact region in the first set of fins. The doped first set of fins 401 may correspond to the second semiconductor fin 222 of FIG. 2, and can be in electrical contact with the collector electrode.

Next, referring to FIG. 5L, a second dopant implantation is performed into the second group of fins 4022 different from the first group of fins 4021 in the second set of fins. The doped second group of fins 4022 may correspond to the first semiconductor fin 212 of FIG. 2, and can be in electrical contact with the base electrode.

Thereafter, a spike annealing treatment is performed on the substrate comprising the fins. For example, the spike annealing treatment is performed at a temperature in the range between 1000° C. and 1050° C. The spike annealing may activate the impurities present in the fins.

Next, referring to FIG. 5M, a second interlayer dielectric layer 28 is deposited on the first interlayer dielectric layer 242 and on the fins. Because the second liner oxide 505 has been formed in the previous step, the second interlayer dielectric layer 28 is deposited on the second liner oxide 505. In other embodiments, if the second liner oxide 505 is not formed in the previous step, the second interlayer dielectric layer 28 can be directly deposited on the first interlayer dielectric layer 242 and on the fins. For example, the second interlayer dielectric layer 28 may be oxide or nitride.

Next, referring to FIG. 5N, the second interlayer dielectric layer 28 is selectively etched to form a first groove 5061, a second groove 5062, and a third groove 5063, so that the fins disposed on the collector region, the base region, and the emitter region are exposed in the first groove 5061, the second groove 5062, and the third groove 5063.

Thereafter, contact members are formed to electrically connect to the exposed fins in the grooves.

In some embodiment, referring to FIGS. 5O to 5Q, the process of forming the contact members will be described/

Referring to FIG. 5O, a metal silicide 507 is formed on the exposed portion of the fins disposed in the first groove 5061, the second groove 5062, and the third groove 5063. In an exemplary embodiment, the metal silicide 507 may be formed using a self-aligned metal silicide (salicide). For example, a metal is first deposited in the grooves, then an etching process is performed on the metal, the metal will react with the fins to form a metal silicide, e.g., titanium-silicon alloy or cobalt-silicon alloy. The metal silicide can reduce the contact resistance of the metal with the fins.

Next, referring to FIG. 5P, a metal layer 27 is deposited on the interlayer dielectric layer 28 completely filling the first groove 5061, the second groove 5062, and the third groove 5063. For example, the metal layer 27 may include tungsten, titanium, cobalt, etc.

Next, referring to FIG. 5Q, a planarization process is performed on the metal layer 27 so that the metal layer 27 in each of the first groove 5061, the second groove 5062, and the third groove 5063 is physically separated to form the contact members 27'.

Thus, a fin-type bipolar semiconductor device is formed according to another embodiment of the present invention.

In other embodiments, a metal silicide may not have to be formed, the metal layer 27 may be directly formed on the interlayer dielectric layer 28 to completely fill the first groove 5061, the second groove 5062, and the third groove 5063. The metal layer 27 is then planarized to form the fin-type bipolar semiconductor device.

Fin-type bipolar semiconductor devices and methods for manufacturing the same have been described in detail so far. The present invention has been described in detail based on examples. In order not to obscure the understanding of the description, techniques and processes known to those of skill in the art are not described.

In accordance with the present invention, the emitter junction is formed in the semiconductor substrate and has thus a relatively large surface area. Furthermore, embodiments of the present invention can reduce or eliminate emitter junction defects. The fin-type bipolar devices thus formed have a reduced leakage current, good linearity and uniform electrical characteristics that can facilitate matching between devices.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A fin-type bipolar semiconductor device comprising:
   a base region comprising a first portion in a semiconductor substrate and a first semiconductor fin adjacent to the first portion and on the first portion;
   a collector region comprising a second portion in the semiconductor substrate and a second semiconductor fin adjacent to the second portion and on the second portion, the second portion adjacent to the first portion;
   an emitter region comprising a third portion in the semiconductor substrate and a third semiconductor fin adjacent to the third portion and on the third portion, the third portion adjacent to the first portion and forming with the first portion an emitter junction in the semiconductor substrate;
   a first liner oxide layer on the base region, the collector region, and the emitter region;
   a filler material layer on the first liner oxide layer;
   a second liner oxide layer on the filler material layer;
   wherein the second portion is not adjacent to the third portion, and
   wherein the first, second, and third semiconductor fins are physically separated from each other by the first liner oxide layer and the filler material layer.

2. The fin-type bipolar semiconductor device of claim 1, wherein the third portion is at least partially surrounded by the first portion.

3. The fin-type bipolar semiconductor device of claim 1, wherein the third portion is disposed on a portion of the first portion.

4. The fin-type bipolar semiconductor device of claim 1, wherein the first and second portions form a collector junction in the semiconductor substrate.

5. The fin-type bipolar semiconductor device of claim 1, wherein the second portion and the third portion are of a first conductivity type, the first portion is of a second conductivity type different from the first conductivity type.

6. The fin-type bipolar semiconductor device of claim 5, wherein the second portion has a doping concentration lower than a doping concentration of the third portion.

7. The fin-type bipolar semiconductor device of claim 1, further comprising a plurality of contact members each separately in electrical contact with one of the first semiconductor fin, the second semiconductor fin, and the third semiconductor fin.

8. The fin-type bipolar semiconductor device of claim 1, wherein the first liner oxide layer is further disposed on a first portion of sidewalls of the semiconductor fins.

9. The fin-type bipolar semiconductor device of claim 8, further comprising an interlayer dielectric layer on the second liner oxide layer.

10. The fin-type bipolar semiconductor device of claim 9, further comprising a metal silicide layer on upper portions of the semiconductor fins.

11. The fin-type bipolar semiconductor device of claim 10, further comprising a plurality of contact members each separately in electrical contact with the metal silicide layer.

12. The fin-type bipolar semiconductor device of claim 11, wherein the interlayer dielectric layer separates the contact members of the base region, the contact members of the collector region, and the contact members of the emitter region from each other.

13. The fin-type bipolar semiconductor device of claim 9, wherein the second liner oxide layer is further disposed on a second portion of the sidewalls of the semiconductor fins, the second portion of the sidewalls of the semiconductor fins being adjacent to the first portion of the sidewalls of the semiconductor fins.

14. The fin-type bipolar semiconductor device of claim 13, further comprising a metal silicide layer on a top portion of each of the semiconductor fins.

15. The fin-type bipolar semiconductor device of claim 14, wherein the top portion is adjacent to the second portion of the sidewalls of the semiconductor fins.

16. The fin-type bipolar semiconductor device of claim 14, wherein the interlayer dielectric layer comprises a plurality of grooves exposing the metal silicide layer.

17. The fin-type bipolar semiconductor device of claim 16, further comprising a metal layer filling the grooves and in direct contact with the metal silicide layer.

* * * * *